United States Patent [19]

Heidemann

[11] 4,398,144

[45] Aug. 9, 1983

[54] APPARATUS FOR DETERMINING THE POSITION OF A SWITCH AND FOR MONITORING THE ASSOCIATED LINE FOR INTERRUPTIONS AND SHORT CIRCUITS

[75] Inventor: Lüder Heidemann, Erlangen, Fed. Rep. of Germany

[73] Assignee: Siemens Aktiengesellschaft, Berlin & Munich, Fed. Rep. of Germany

[21] Appl. No.: 225,972

[22] Filed: Jan. 19, 1981

[30] Foreign Application Priority Data

Jan. 21, 1980 [DE] Fed. Rep. of Germany ....... 3001940

[51] Int. Cl.³ ............................................. G01R 31/02
[52] U.S. Cl. ........................................ 324/51; 340/644
[58] Field of Search ......................... 324/51, 415, 424; 340/644

[56] References Cited

U.S. PATENT DOCUMENTS 4,340,852  7/1982  Togneri .................................. 324/51

FOREIGN PATENT DOCUMENTS 2151787  3/1973  France .
 801276  9/1958  United Kingdom ................ 340/644

OTHER PUBLICATIONS

Beckman, Diode Test Circuit, Western Electric Technical Digest No. 43, Jul. 1976, pp. 7 & 8.

*Primary Examiner*—Stanley T. Krawczewicz
*Attorney, Agent, or Firm*—Kenyon & Kenyon

[57] ABSTRACT

For determining the position of a switch and for monitoring the connecting line for short circuits and interruptions, threshold stages containing Zener diodes are provided. A voltage or a current having periodically changing amplitude, preferably a triangular waveform, is fed to the switch via the line being monitored. The threshold voltages of the Zener diodes may be equal or staggered, depending on the manner of connection of the diodes in the circuit. For instance, if a Zener diode is connected in series with the switch, which may be either make contact or break contact and a Zener diode is shunted across the switch, Zener diodes with the same threshold voltage are used.

6 Claims, 9 Drawing Figures

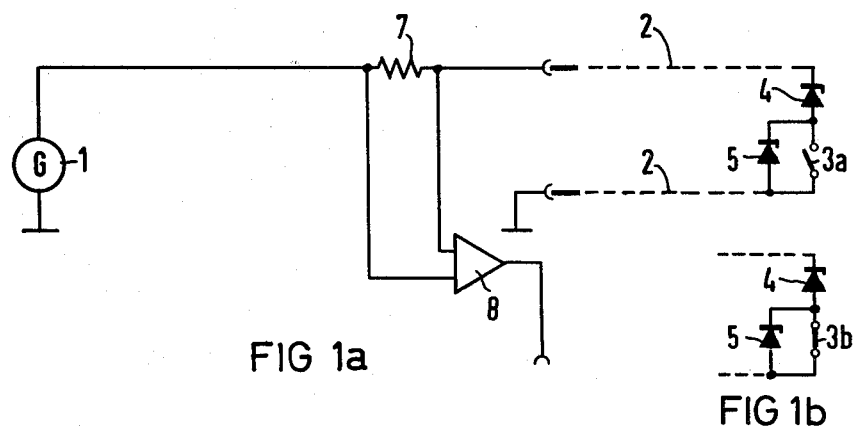
FIG 1a
FIG 1b
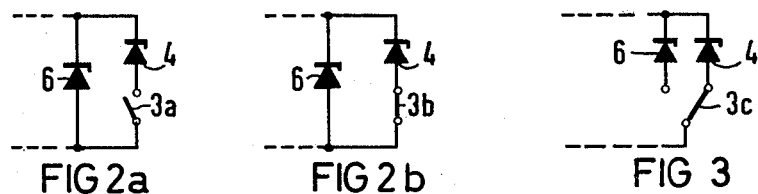
FIG 2a    FIG 2b    FIG 3
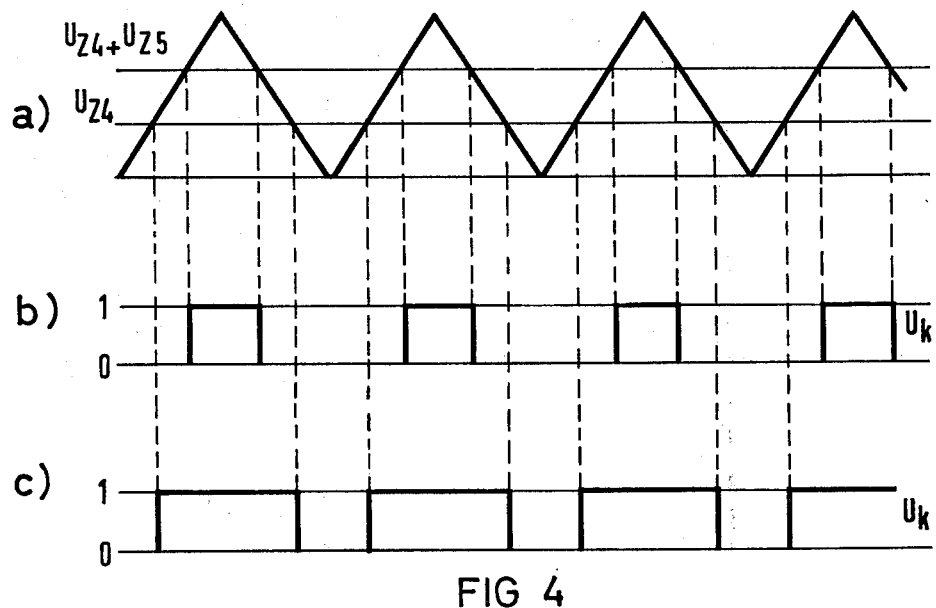
FIG 4

APPARATUS FOR DETERMINING THE POSITION OF A SWITCH AND FOR MONITORING THE ASSOCIATED LINE FOR INTERRUPTIONS AND SHORT CIRCUITS

BACKGROUND OF THE INVENTION

The present invention relates to an apparatus for determining the position of a switch and for monitoring the two-wire line connected to the switch for interruptions and short circuits. More particularly, the invention provides an evaluating apparatus which contains a generator for generating a test voltage or a test current having a periodically changing amplitude and which delivers at least one signal indicating the switch position and the presence of a disturbance on the line.

Known arrangements of this kind operate with an AC voltage or with alternating positive and negative square wave pulses as the test voltage and require, for determining the position of the switch, that the switch be designed as a double-throw switch and that a separate rectifier element be provided in each switch position current path. These rectifier elements are connected antiparallel, so that the evaluating device evaluates the direction of the current as the criterion for the switch position, and the states "current in both directions" or "no current" are the criteria for a line short circuit or for an interruption of the line (Publication "Siemens MDL-System", October 1974, pages 3, 4 and 5, and DE-AS No. 25 43 996). The use of a double-throw switch as the switch often means extra cost, since auxiliary switches provided for reporting purposes in switchgear and relays are as a rule designed as break contacts or make contacts.

It is an object of the present invention to provide an arrangement which permits, while using simple means, an indication of the switch position of a make or break contact as well as of a short circuit or an interruption in the line.

SUMMARY OF THE INVENTION

According to the present invention, the abovedescribed problem is solved by an evaluating apparatus which comprises a generator providing a periodic test voltage or a periodic test current having a finite flank slope, a threshold stage associated with the switch, and a trigger circuit which evaluates the output signals of the threshold stage. One or more threshold stages may be used, and, advantageously, each threshold stage contains a Zener diode. It is particularly advantageous if the waveform of the test voltage or the test current is essentially triangular.

BRIEF DESCRIPTION OF THE DRAWINGS

FIGS. 1a and 1b are schematic diagrams of a circuit embodying the teachings of the invention;

FIGS. 2a and 2b illustrate a variation of the circuit of FIG. 1;

FIG. 3 shows the circuit for use with a changeover switch;

FIGS. 4a, 4b, and 4c show the generator voltage and the output of the trigger circuit for differing switch positions.

DETAILED DESCRIPTION OF THE INVENTION

Figure 5:
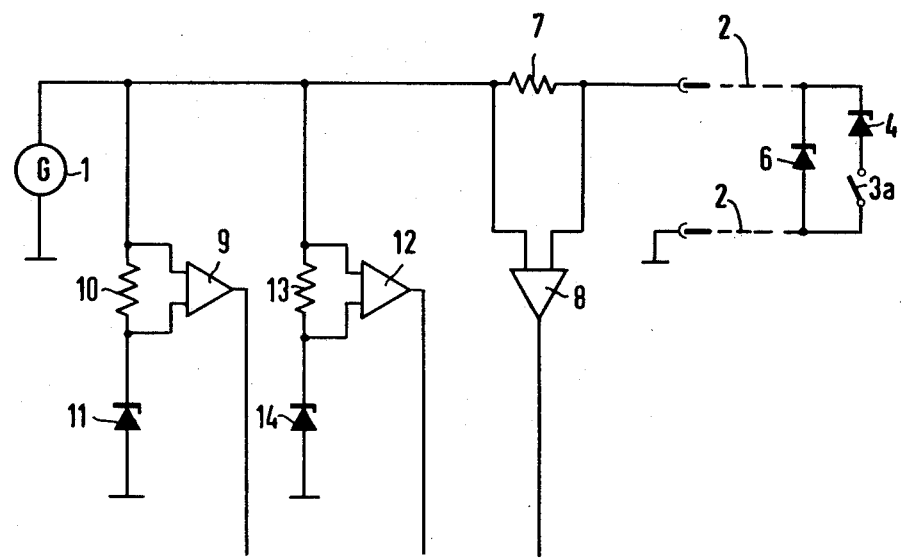
FIG. 5 is a schematic diagram of another embodiment of the invention having separate trigger circuits for monitoring Zener voltage levels in a suitable circuit.

In FIG. 1a a generator 1 supplies a voltage or a current with periodically changing amplitude and apparatus having a finite slope, preferably a voltage or a current with triangular waveform. A connecting line 2 connects the generator to switch 3a which is a make contact and is connected in series with a Zener diode 4. Switch 3a is shunted by a further Zener diode 5. The threshold voltages of Zener diodes 4 and 5 are equal. This circuit arrangement need not be changed when a break contact 3b is used instead of the make contact 3a. (see FIG. 1b)

In alternative embodiment, shown in FIGS. 2a and 2b, the series circuit consisting of make contact 3a or break contact 3b and Zener diode 4 is shunted by Zener diode 6 (instead of shunting the switch of FIG. 1 by Zener diode 5). In this case, the threshold voltage of Zener diode 6 must be chosen higher than that of Zener diode 4 and can be, for instance, twice as high. The same holds for Zener diodes 4 and 6 in the case where a double-throw (change-over) switch 3c (FIG. 3) is used as the switch as shown in FIG. 3.

Referring back to FIG. 1, it is seen that trigger circuit 8 is connected across resistor 7 which is connected in series in line 2. Depending on the switch position in accordance with the condition of the line, the output signal of the trigger circuit takes the wave form shown in FIGS. 4b and 4c. The waveform depending on the switch positions results from application of the test voltage delivered by the generator 1 and which is shown in FIG. 4a along with the threshold voltages $u_{z4} + u_{z5}$ of the Zener diodes. If, as shown in FIG. 4a, the threshold voltage of Zener diode 6 is chosen twice as high as that of Zener diode 4, it corresponds to the sum of the zener voltages $u_{z4} + u_{z5}$. FIG. 4b shows the output pulses from the trigger circuit which are obtained when the switch is open. The output pulses shown in FIG. 4c are obtained when the switch is closed. In the event of a short circuit, the output signal has the voltage shown by the level of voltage $u_k$ marked 1. If the line is interrupted, the output signal of the trigger circuit is 0 volts. Further evaluation can be accomplished by means of time delay stages.

FIG. 5 shows a second illustrative embodiment of the invention which differs from the embodiment of FIG. 1 by the presence of two additional trigger circuits 9 and 12. Trigger circuit 9 is connected across resistor 10 and the combination forms, together with Zener diode 11, a series circuit connected to the test voltage. A similar series circuit is formed from Zener diode 14 and parallel connected resistor 13 and trigger circuit 12. The threshold voltage of Zener diode 11 corresponds, for instance, to the threshold voltage of Zener diode 4, and the threshold voltage of Zener diode 14 corresponds, for instance, to the threshold voltage of Zener diode 6 (or to the sum of the threshold voltage of diodes 4 and 5 of FIG. 1). For further evaluation, the output signals of trigger circuits 8, 9 and 12 can be connected to an EXCLUSIVE-OR gate.

As shown in FIG. 4a, the test voltage is always positive. If the test voltage provided also has a negative component, the latter can be used for achnowledgement purposes.

What is claimed is:

1. In an apparatus for use in determining the position of a switch connected to a two-wire line and for monitoring the two-wire line for interruption and short circuit disturbances, the apparatus including at least one generator with an output test signal having a waveform of periodically changing amplitude, the two-wire line connecting the generator to the switch for transmitting the test signal thereto, the apparatus delivering signals indicating switch position and the presence of a disturbance, the improvement in which the waveform of the output test signal of the generator has flanks with finite slopes and further comprising:

threshold means coupled to the switch for providing an output signal responsive to switch position, the threshold means including a plurality of threshold circuits assigned to respective positions of the switch and having different threshold levels for permitting current flow at different voltage levels of the same polarity of the two-wire line, whereby the time current flows at the output of the threshold means during a cycle of the output test signal of the generator is representative of switch position and of disturbances in the two-wire line; means including a trigger circuit coupled to the output of the threshold means for evaluating the output signal thereof and emitting an output signal representative of the time current is present at the output of the threshold means.

2. In an apparatus in accordance with claim 1, the further improvement comprising:

each threshold circuit comprising a Zener diode, the Zener diodes of all the threshold circuits being biased in the same direction between the wires of the two-wire line.

3. In an apparatus in accordance with claim 2, the further improvement comprising the waveform of the test signal being substantially triangular.

4. In an apparatus in accordance with claim 3, the further improvement comprising:

the switch realized as one of a break contact and a make contact and connected in series with a first Zener diode and a second Zener diode shunt-connected across the switch, the series and the shunt-connected Zener diodes having the same threshold voltage.

5. In an apparatus in accordance with claim 3, the further improvement comprising:

a switch, realized as one of a break contact or a make contact, connected in series with a first Zener diode and a second Zener diode shunt-connected across the series combination, the second Zener diode having a different threshold voltage than the first Zener diode.

6. In an apparatus in accordance with claim 3, in which the switch is a double-throw switch, the further improvement comprising:

a first Zener diode connected in a current path dependent on one position of the switch and a second Zener diode connected in a current path dependent on another position of the switch, the second Zener diode having a threshold value higher than that of the first Zener diode.

* * * * *